(12) United States Patent
Wendorff et al.

(10) Patent No.: US 6,420,781 B1
(45) Date of Patent: Jul. 16, 2002

(54) METHOD FOR PRODUCING EMULATION CIRCUIT CONFIGURATION, AND CONFIGURATION WITH TWO INTEGRATED CIRCUITS

(75) Inventors: Wilhard Von Wendorff; Albrecht Mayer, both of München (DE)

(73) Assignee: InfineonTechnologies AG, Munich (DE)

(*) Notice: Subject to any disclaimer, the term of this patent is extended or adjusted under 35 U.S.C. 154(b) by 0 days.

(21) Appl. No.: 09/164,118

(22) Filed: Sep. 30, 1998

(30) Foreign Application Priority Data

Sep. 30, 1997 (DE) .......................... 197 43 264

(51) Int. Cl.$^7$ ............................... H01L 23/02
(52) U.S. Cl. ..................... 257/686; 257/777
(58) Field of Search ................. 257/686, 778, 257/690, 777

(56) References Cited

U.S. PATENT DOCUMENTS 3,809,625 A * 5/1974 Brown et al. ................. 204/15
5,475,236 A * 12/1995 Yoshizaki .................... 257/690
5,825,080 A * 10/1998 Imaoka et al. ............... 257/659
5,923,090 A * 7/1999 Fallon et al. ................ 257/777

OTHER PUBLICATIONS

"Promising New Fabrication Process Developed for Stacked LSI'S" (Yasumoto et al.), IEDM 84, pp. 816–819.

* cited by examiner

Primary Examiner—Phat X. Cao
(74) Attorney, Agent, or Firm—Laurence A. Greenberg; Werner H. Stemer; Ralph E. Locher

(57) ABSTRACT

In an uppermost wiring plane of a mass-produced circuit of a micro-controller, contact faces are provided. To produce an emulation circuit a further wiring plane is added to the mass-produced circuit by way of which internal signals are carried to an external terminal. Acting as an interface is an output chip with further emulation logic capabilities which is applied to the emulation circuit in the manner of a flip-chip assembly.

7 Claims, 5 Drawing Sheets

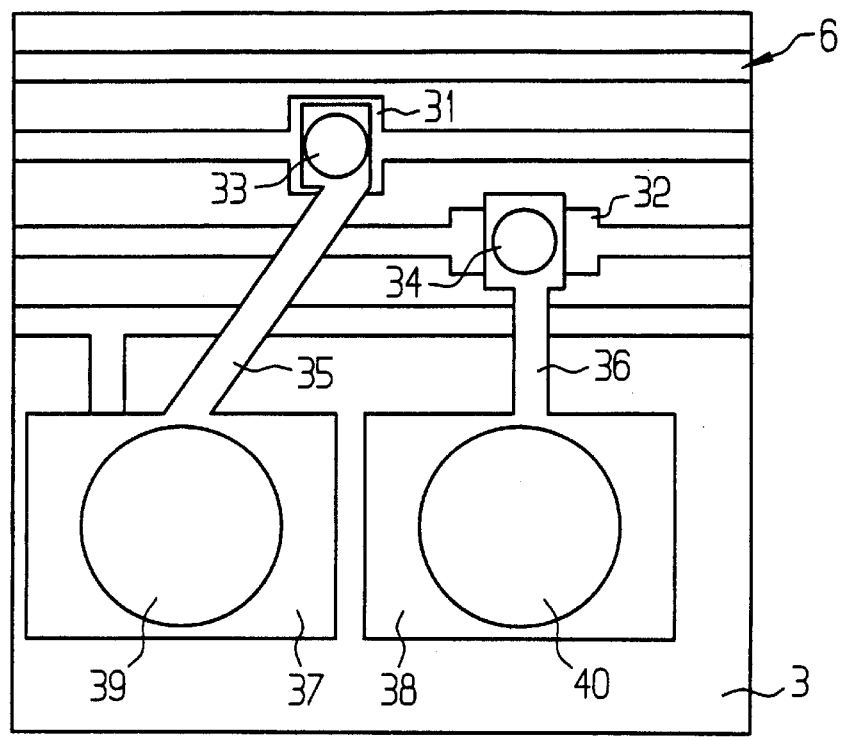
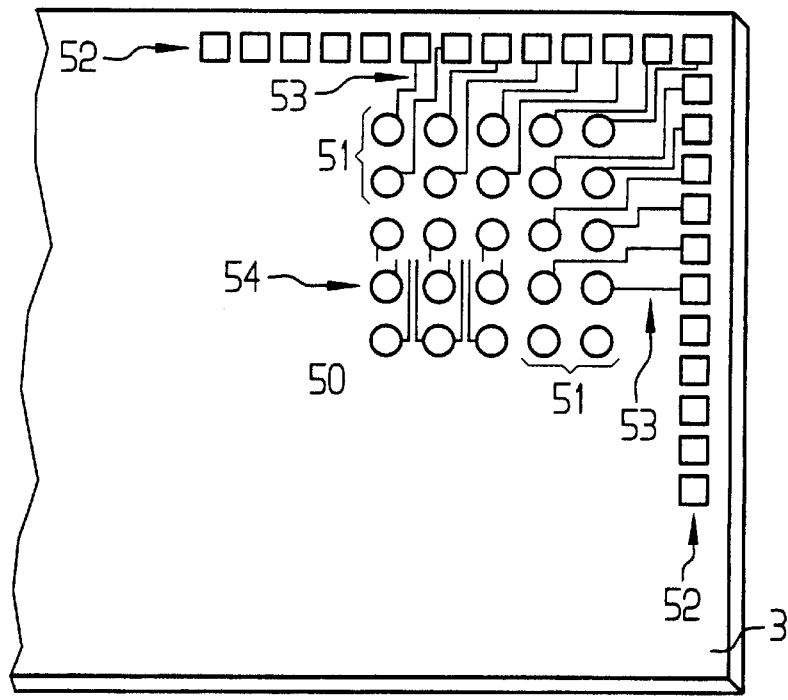

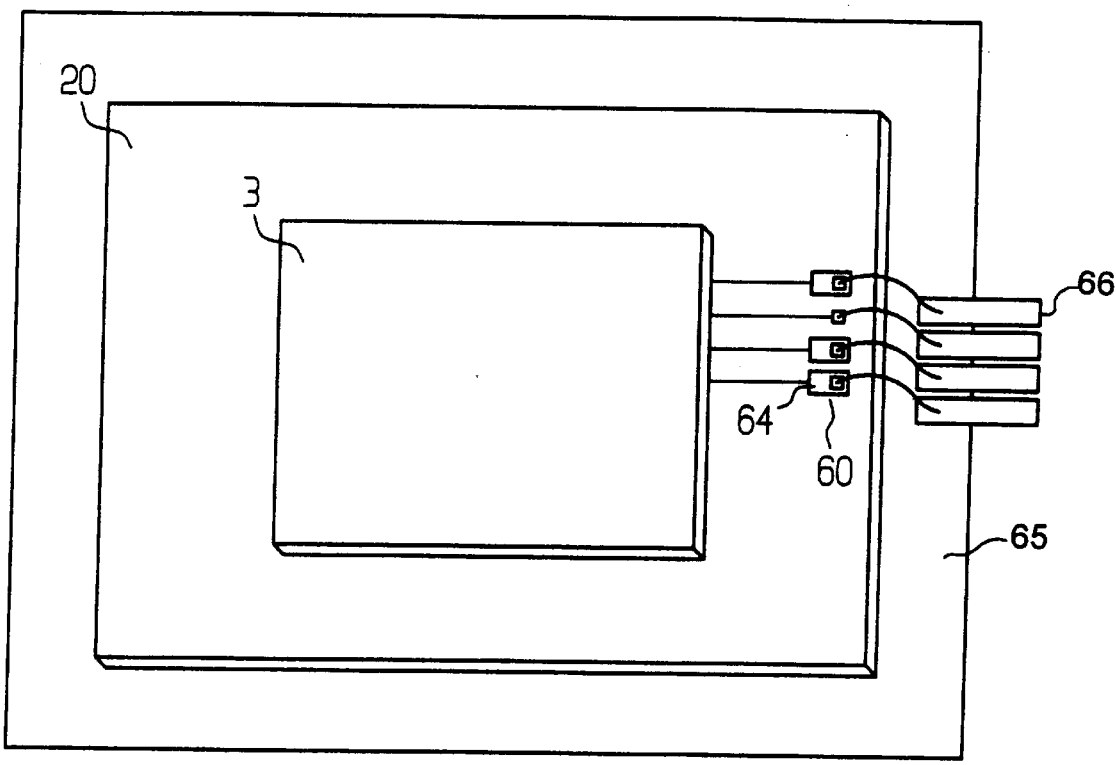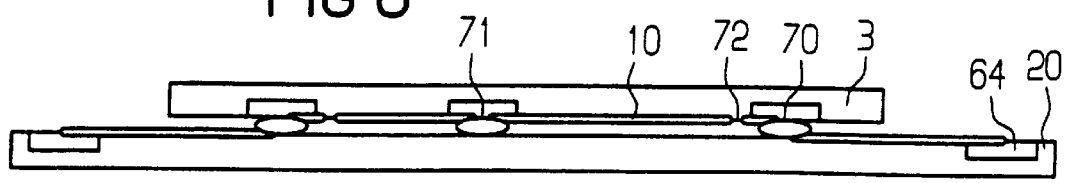

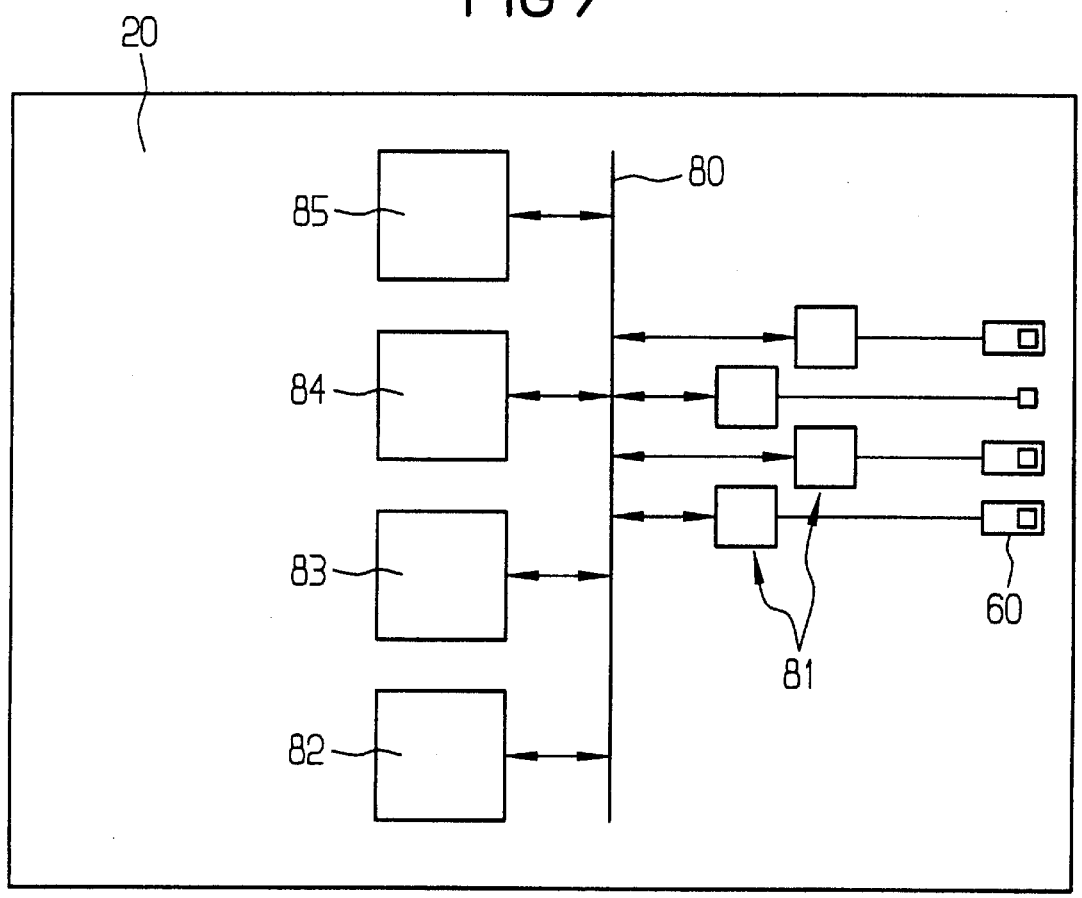

METHOD FOR PRODUCING EMULATION CIRCUIT CONFIGURATION, AND CONFIGURATION WITH TWO INTEGRATED CIRCUITS

BACKGROUND OF THE INVENTION

Field of the Invention

The invention relates to a method for producing an emulation circuit configuration from an integrated circuit, and to a configuration having two integrated circuits.

Developing applications systems that include integrated circuits require driving certain circuits, especially microprocessors or micro-controllers, in the applications system in real time. This involves monitoring many electrical and chronological sequences, not accessible during later operations, within the circuit itself, which is known as in-circuit emulation (ICE).

The application system can be tested, optimized, and further developed together with the micro-controller.

Producing a variant of a mass-produced circuit suitable for in-circuit emulation is problematic. Until now, a bond-out version was made, in which additional internal signals can be picked up externally. A circuit periphery with external components is also created, by which interrupt points in the program sequence can for instance be set and data and/or program memories varied and register states recorded over the course of time. An operator computer forms the interface with the developer.

The effort and expense for producing an emulation circuit is extraordinarily high. Compared with mass production techniques, it typically involves considerable delay. Furthermore, the emulation circuit has a different operating behavior over time compared with the mass-produced circuit, and this pertains particularly to unwanted signals and makes troubleshooting more difficult.

In the literature by M. Yasumoto et al, "Promising New Fabrication Process Developed for Staged LSI's", IEDM 84, pp. 816–819, a configuration of two integrated circuits that are interconnected at their surfaces facing one another is shown. The respective contact faces accessible at the surface are located one over the other and are bonded via gold contact points. The two circuits each contain only transistors of one type, and together they form a ring oscillator. One of the circuits contains external contacts.

SUMMARY OF THE INVENTION

It is accordingly an object of the invention to provide a method for producing an emulation circuit configuration, and a configuration with two integrated circuits, which overcome the above-mentioned disadvantages of the prior art methods and devices of this general type, which is simple to produce.

With the foregoing and other objects in view there is provided, in accordance with the invention, a method for producing an emulation circuit configuration from an integrated circuit, which includes: providing an integrated circuit including a first wiring layer having conductor tracks with widened portions functioning as contacts; applying a further wiring layer having conductor tracks to the integrated circuit; connecting the conductor tracks of the further wiring layer to the widened portions of the first wiring layer; providing contact faces on the conductor tracks of the further wiring layer for allowing access to additional output signals provided in addition to regular output signals of the integrated circuit; and connecting the contact faces of the further wiring layer to external chip connections.

The effort and expense for the additional production process steps for the emulation variant, compared with the mass-produced chip, are tolerable. The additional effort and expense to the mass-produced chip, for instance for the contacting faces in the uppermost wiring plane needed for the emulation variant, require hardly any space. It is advantageous that the mass-produced chip and the emulation variant thereof are based on the same starting chip and therefore have virtually identical operating behavior over time.

Expediently, a second circuit is provided for picking up internal signals. It is applied to the mass-producted chip, enhanced by the additional production process steps, by a method that relies on the flip-chip technique.

The additional second chip contains suitable circuits for interrupt points, observation channel memories, ROM emulation memories, and signal drivers. Furthermore, it can be used for different mass-produced chips, as long as their contact faces are disposed in the same grid pattern in the uppermost, additional wiring plane and furnish the various corresponding signals. The emulation circuit configuration is therefore available quickly and at reasonable expense and behaves virtually identically to the mass-produced chip. Because of the close spatial coupling with a ROM emulation memory, a maximum system operating speed can be attained.

In accordance with an added feature of the invention, there is the step of placing a further integrated circuit having input signal terminals and contact faces above the further wiring layer, and electrically conductively connecting the input signal terminals of the further integrated circuit to the contact faces of the further wiring layer of the integrated circuit.

In accordance with an additional feature of the invention, there is the step of forming contact lugs on the contact faces of the further wiring layer that correspond in position to the contact faces of the further integrated circuit, and connecting the contact lugs with the contact faces of the further integrated circuit.

In accordance with an another feature of the invention, there are the steps of: forming peripheral lands on the further integrated circuit; and enclosing the integrated circuit and the further integrated circuit in a package having external terminals and connecting the peripheral lands to the external terminals for outputting output signals.

In accordance with an additional feature of the invention, there is the step of connecting the contact faces of the further wiring layer of the integrated circuit to a terminal for a supply potential via the conductor tracks each having a portion with a reduced cross-sectional area, and subsequently severing the portion with the reduced cross-sectional area of the conductor tracks with a current pulse impressed via the further integrated circuit.

With the foregoing and other objects in view there is also provided, in accordance with the invention, a configuration having two integrated circuits, including: a first integrated circuit having an uppermost wire layer with contact faces and a given area; a second integrated circuit disposed on the first integrated circuit and having contact faces corresponding in position to the contact faces of the first integrated circuit, the second integrated circuit further having an area larger than the given area of the first integrated circuit and periphery lands forming external contact terminals; and an electrically conductive material connecting the contact faces of the first integrated circuit to the contact faces of the second integrated circuit.

In accordance with an added feature of the invention, the electrically conductive material connecting the contact faces of the first integrated circuit to the contact faces of the second integrated circuit are contact lugs.

In accordance with an additional feature of the invention, the first integrated circuit and the second integrated circuit each have a surface at which respective contact faces are accessible and face one another.

In accordance with another feature of the invention, a number of the contact faces of the first integrated circuit form a grid-shaped configuration having equal spacings between the contact faces in one direction.

In accordance with a further added feature of the invention, the first integrated circuit includes one of a microprocessor and micro-controller each having registers, and the second integrated circuit having at least one function element selected from the group consisting of driver circuits connected to the periphery lands for external access, an observation channel memory for an in-circuit emulation connected to the registers, a program emulation memory for an in-circuit emulation, and logic circuits for setting and monitoring interrupt points of an emulation program.

In accordance with a further additional feature of the invention, at least one of the at least one function element forms an interface with the first integrated circuit and is a programmed programmable logical circuit.

In accordance with yet another feature of the invention, at least one of the at least one function element forms an interface with the first integrated circuit and is a mask-programmable gate array.

In accordance with a concomitant feature of the invention, the at least one function element includes at least one of logic circuits for setting and monitoring interrupt points of the emulation program and buffer circuit elements for signal input and output functions with respect to the first integrated circuit.

Other features which are considered as characteristic for the invention are set forth in the appended claims.

Although the invention is illustrated and described herein as embodied in a method for producing an emulation circuit configuration, and a configuration with two integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a partial, plan view of an uppermost wiring plane of the emulation chip variant;

FIG. 4 is a fragmentary, plan view of the uppermost wiring plane of the emulation chip variant;

FIG. 5 is a bottom perspective view of the emulation circuit configuration with the emulation chip variant, the output chip, and a chip package;

FIG. 6 is a cross-sectional view of the emulation chip variant and the output chip of FIG. 5 without the chip package; and FIG. 7 is a block circuit diagram of the output chip.

DESCRIPTION OF THE PREFERRED EMBODIMENTS

Figure 1:
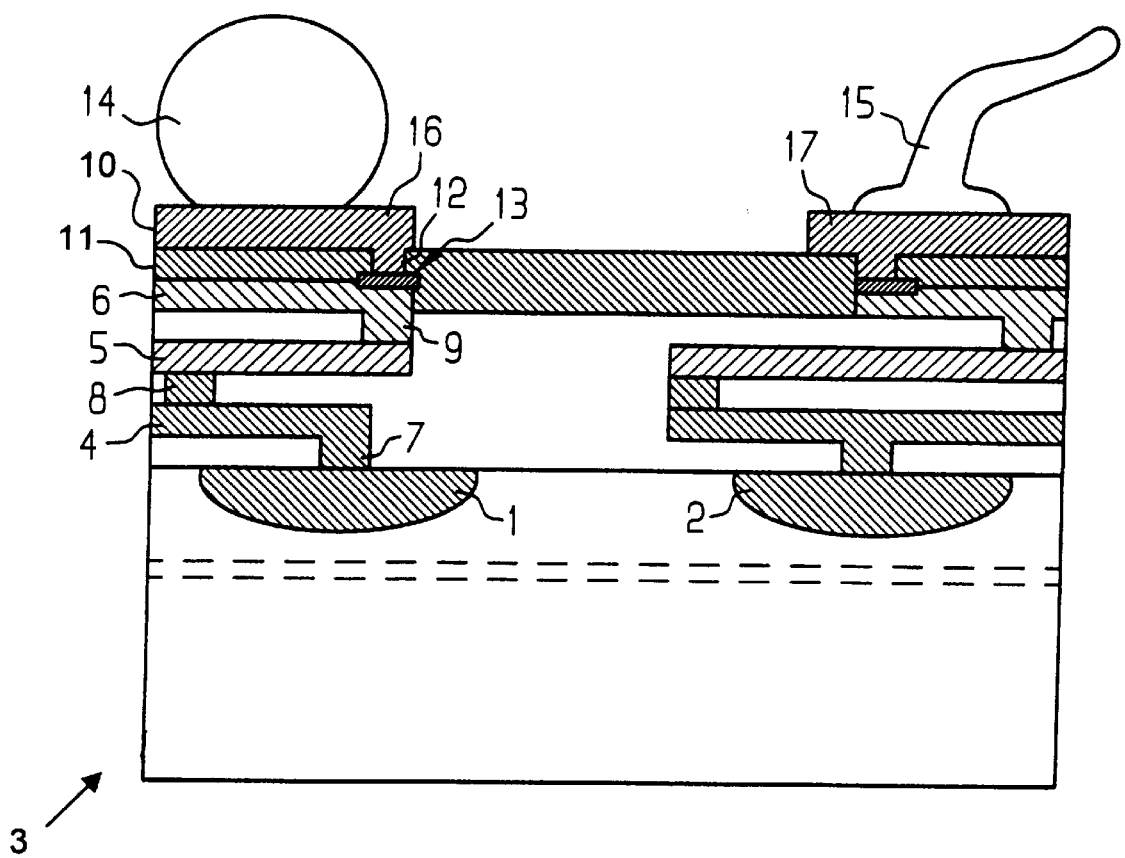
FIG. 1 is a cross-sectional view through an emulation chip variant of a mass-produced chip enhanced by additional production process steps according to the invention.

Referring now to the figures of the drawing in detail and first, particularly, to FIG. 1 thereof, there is shown doping zones 1, 2 in a semiconductor substrate. The doping zones 1, 2 are connected to one another via conductor tracks in wiring layers 4, 5, 6. The wiring layers 4–6 may contain conductor tracks of metal, polysilicon, or other electrically conductive materials. Various conductor planes are insulated from one another by passive layers, formed for instance with silicon oxides.

Conductor tracks of various layers are electrically connected to one another via contacts 7, 8, 9, which are mounted inside via holes disposed in the insulation layers. The mass-produced chip intended for mass production, in the embodiment shown, has the three wiring layers 4–6 in their respective planes of which an uppermost wiring layer 6 is covered with a non-illustrated protective and passivation layer.

The emulation variant shown in FIG. 1 differs from the mass-produced chip in that a further connecting or wiring layer 10 having conductor tracks, separated by a further insulation layer 11, is disposed over the uppermost wiring layer 6. A contact 12 connects the conductor tracks of the wiring layer 10 to the conductor tracks of the wiring layer 6. In the conventional way, the chip is sealed off on its top with a non-illustrated layer. For the vertical contacts 12, the uppermost wiring layer 6 of the mass-produced chip has corresponding contact faces 13. In the production chip, because of the lack of the wiring plane 10, the contact faces 13 are unused and are not necessary for the actual function of the chip. The additional expense for the contact faces 13 in terms of surface area is minimal. By use of the additional wiring layer 10 and the contacts 12, signals that in the mass-production chip are not normally carried to an outside pin are now carried to the chip surface. In the emulation variant shown, however, the signals can be picked up externally via contact 14, 15. The signal lines that can be tapped in this way are for example data and signal buses located internally in the chip. The contact lug 14 is applied to a conductor track 16 shown on the left in the uppermost wiring plane 10 of the emulation chip 3, and by the contact lug 14 the signal of the conductor track 16 is further processed in an output chip (see FIG. 2). As an alternative contact method, a contact by the bond wire 15 is shown for a conductor track 17 on the right in the uppermost wiring plane 10. The bond wire leads to a package pin.

To produce the emulation chip 3 shown in FIG. 1, the mass-produced chip is produced without modification, except for its upper wiring layer 6. Instead of the otherwise usual passivation layer, in further production steps known per se the insulation layer 11, the further wiring layer 10, and the contact lugs 14 or the bond wires 15 are applied. This requires approximately 3 to 4 additional masking steps compared with the production of the unmodified mass-produced chip. It would also be conceivable to produce the additional layers by laser beam writing techniques known per se, since the emulation chips need to be manufactured only in small numbers, and the structure size is not critical.

Figure 2:
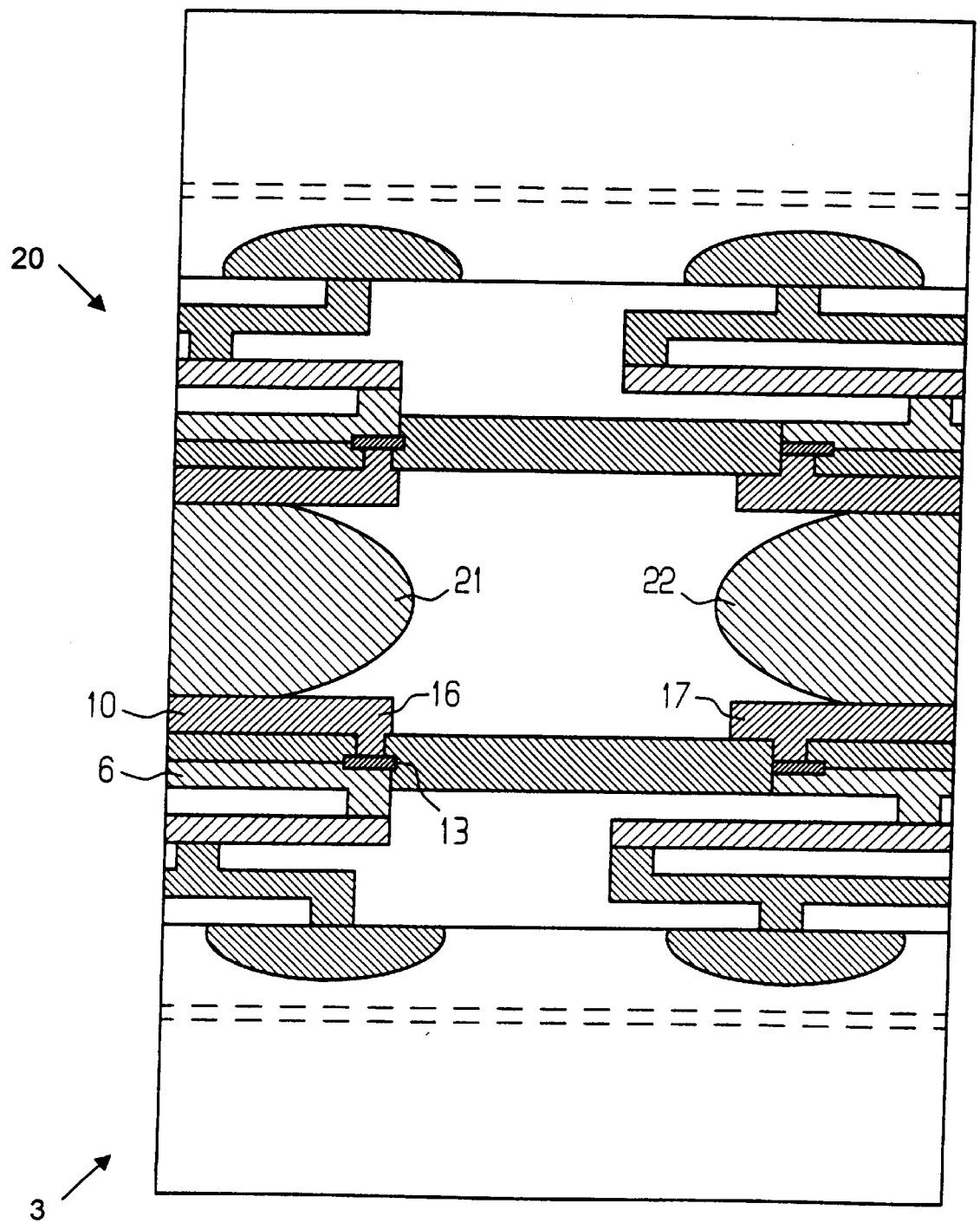
FIG. 2 is a partial, cross-sectional view through an emulation circuit configuration with the emulation chip variant of the mass-produced chip, and an output chip with additional logic circuits and output drivers.

In an advantageous refinement of the invention, FIG. 2 shows a further circuit 20, which is used to output the signals applied to the conductor tracks 16, 17. The output chip 20 has additional circuits and driver stages discussed later in the application which are suitable for in-circuit emulation. To produce the emulation chip configuration contact lugs 21, 22 are applied to the corresponding contact points of the conductor tracks 16, 17. The contact lugs include solderable material. Next, the chip 20, which has suitable contact faces at a side of the respective solder lugs 21, 22, is soldered. The processing operations rely on the flip-chip technique with which integrated circuits are bonded and secured to printed circuit boards. In the present case, however, it is two integrated circuits that are joined to one another. The surfaces by way of which the circuit structures of the circuits and the lands are accessible face one another.

As an alternative to the orientation of the output chip 20 shown in FIG. 2, a different output chip may be provided, which is disposed above the emulation chip 3 in the manner of vertical integration. A substrate of the second integrated circuit is mounted directly over the wiring layer 10, and the transistor structures are introduced into the substrate from the opposite surface facing away from the wiring layer 10. Vertical chutes in the second chip are carried to the connecting faces 16, 17 and provide for connection of the faces with the function units in the second chip.

The plan view shown in FIG. 3 of the surface of only the emulation chip 3 shows the conductor tracks of the uppermost connecting layer 6 of the mass-produced chip. Four bus lines are shown in the detail of FIG. 3. The lines have contact faces 31, 32, on each of which via hole contacts 33, 34 are disposed for contact with the wire layer 10 additionally present in the emulation chip. The contact faces 31, 32 are widened portions of the lines, embodied in accordance with the design rules. Lines 35, 36 of the wiring layer 10, which are expediently made of metal, connect the contact faces 31, 32 with terminal pads 37, 38, at which contact with the outside is made by bond wires or solder lugs 39, 40. The pads 37, 3.8 are expediently located at sites below which no sensitive components that could be destroyed by the bonding or soldering are located. The diameter of a conductor track in the wiring layer 6, in current technologies, is on the order of magnitude of 3 $\mu$m and below, while the extent of the terminal pads 37 or 38 in the wiring layer 10 is of an order of magnitude of approximately 150 $\mu$m. The view shown in FIG. 3 is therefore not to scale, for the sake of visual clarity.

The plan view in FIG. 4 of the emulation chip enhanced with additional production steps compared with the mass-produced chip shows a detail 50 of a configuration of solder lugs. In addition, the normal output pads also present in the mass-produced chip are provided, onto which the bond wires to the package pins are stamped. The contact with the output chip is made only via the contact lugs, however. The "normal" pads 52 at solder lugs 51 are therefore also passed through corresponding lines 53 in the wiring layer 10. The solder lugs are located in the outer region, while other solder lugs 54, located toward the inside of the surface, are connected to internal signal lines in the chip that are not directly accessible from outside in the mass-production chip, such as internal bus lines in the chip. The solder lugs are disposed in a predetermined grid pattern. In the example shown, the solder lugs are each equally spaced apart from one another in every direction. For horizontal and vertical directions, in general the spacings can be different.

Expediently, the grid pattern is the same for different types of mass-produced chips. The solder lugs corresponding in position to one another also carry functionally equivalent signals. This makes it possible for the same output chip to be used for different emulation chips and therefore for different types of mass-produced chip. This is economical and reduces the time page for producing the emulation chip configuration.

FIG. 5 shows that the output chip 20 is larger in area than the emulation chip 3. The structure shown in FIG. 4 is oriented toward the output chip 20 in FIG. 5. Circuits suitable for the in-circuit emulation are disposed in the emulation chip 3. Examples of these are drivers, by which the output signals are furnished to external pads 60. An observation channel memory (or so-called trace buffer), in which a look back in time of registers selected for the circuit function test are stored in memory, or a program emulation memory, which contains the operating program for the micro-controller to be tested, are also expedient. During normal operation, the operating program is stored in a ROM in the micro-controller. Because of the close spatial coupling between the program emulation memory and the emulation chip, the corresponding connecting lines are short, and the emulation memory can be operated at the system operating speed. Moreover, the output chip 20 contains suitable logic for setting and monitoring program interrupt points. The pads 60 of the output chip carry signals that are connected to the inner solder lugs 54 of the emulation chip 3. Expediently, the pads 60 are assigned protection structures 64 against electrostatic discharges (ESD), which in the event of an electrostatic overvoltage dissipate the charge pulse to a supply voltage terminal. The output pad 63 is connected for instance to one of the solder beads 51 of the emulation chip 3, which act as an output in the mass-production chip as well. No ESD protection structure is therefore provided in the output chip. The pads are located on a pad ring on the periphery of the output chip 20. The entire configuration of the emulation chip 3 and the output chip 20 is in turn enclosed within a package 65 with output pins 66.

In FIG. 7, a block circuit diagram of the output chip 20 is shown. The output chip includes a bus 80, by way of which internal communications run. On the output side upstream of the pads 60, a driver 81 is incorporated into each output line, and by use of the driver 81 the signals to be output are amplified and decoupled from the internal circuit blocks. The function blocks 82, . . . , 85 contain those function units that are necessary for the in-circuit emulation and for the processing of the signals to be output and monitored, as described above. The function block 82 contains a trace buffer memory. The function block 83 contains a program emulation memory. The function block 84 contains a logic for setting and monitoring program interrupt points. The function block 85 forms an interface with the signals that are picked up by the emulation chip 3. It contains corresponding buffer drivers.

The function units of the output chip 20 can be furnished in hard-wired form. In that case, the emulation chip 3 must always be adapted to the fixed interface in the output chip 20. Function units relevant to the interface are advantageously embodied in programmable form. Programmable logic is especially suitable for this purpose. They are integrated on the output chip along with the function units not relevant to an interface, which remain the same in all applications. Via the programmable logic, the output and input signals of the emulation chip 3 are carried to the other function units. Such programmable logic circuit blocks are available, for instance in the form of a field programmable gate array (FPGA). A FPGA is constructed in modular fashion. Each block essentially contains logic circuit elements and memory elements and adjustable switches. The switch position is selected such that the desired logic function is obtained for a desired timing behavior. The set state of the switches is defined via the content of a volatile memory. Depending on the memory contents, the logic functions of the interface can thus be adapted to whichever emulation circuit is connected to it at the time. In the present exemplary embodiment, the function blocks 84 and 85 are preferably embodied as FPGAs. The functionality of the interface with the emulation chip can be adapted very flexibly, both to the emulation chip and to the manufacturer of the other emulator hardware.

Instead of a programmable logic circuit, a gate array may also be provided. This is a regular configuration of prefabricated transistors, which in further production steps are then connected to conductor tracks in metal planes. The adaptation of the output chip to the desired interface properties is done here during the final step of its production, by applying a suitable conductor track. Therefore, the interface is mask-programmable with regard to the production masks for the wiring.

FIG. 6 shows a cross section through the configuration chips 3 and 20 of FIG. 5. The ESD protected output pad 60, 64 is connected via a solder bead 70 to the emulation chip 3, which is connected to an internal signal line. As long as the connection between the solder bead 70 and the output pad 60, 64 has not yet been made during assembly, the line in the emulation chip 3 that is connected to the solder bead 70 is at risk from ESD. For this reason, in the wiring layer of the emulation chip 3, the conductor track 10 is therefore formed between the solder bead 70 and a solder bead 71 intended for connection to a supply potential, preferably ground. The conductor track preferably has a constriction of reduced cross section 72. The constriction is dimensioned such that it can dissipate an ESD pulse to the solder bead 71 of the supply terminal but can be severed by a current pulse impressed from outside. Once the solder bead 70 is connected to the ESD-protected pad 60, 64 once the two chips have been assembled, the constriction 72 is severed by a current pulse impressed from outside. The ground connection described above between the solder beads 70, 71 is then no longer effective.

We claim:

1. A method for producing an emulation circuit configuration from an integrated circuit, which comprises:

providing a first integrated circuit including a first wiring layer having conductor tracks with widened portions functioning as contacts;

applying a further wiring layer having conductor tracks to the first integrated circuit;

connecting the conductor tracks of the further wiring layer to the widened portions of the first wiring layer;

providing contact faces on the conductor tracks of the further wiring layer for allowing access to additional output signals provided in addition to regular output signals of the first integrated circuit;

connecting the contact faces of the further wiring layer to external chip connections;

placing a second integrated circuit having input signal terminals and contact faces above the further wiring layer;

electrically conductively connecting the input signal terminals of the second integrated circuit to the contact faces of the further wiring layer of the first integrated circuit;

connecting the contact faces of the further wiring layer of the first integrated circuit to a terminal for a supply potential via the conductor tracks each having a portion with a reduced cross-sectional area; and subsequently severing the portion with the reduced cross-sectional area of the conductor tracks with a current pulse impressed via the second integrated circuit.

2. The method according to claim 1, which further comprises:

forming contact lugs on the contact faces of the further wiring layer that correspond in position to the contact faces of the second integrated circuit, and connecting the contact lugs with the contact faces of the second integrated circuit.

3. The method according to claim 1, which further comprises:

forming peripheral lands on the second integrated circuit; and enclosing the first integrated circuit and the second integrated circuit in a package having external terminals and connecting the peripheral lands to the external terminals for outputting output signals.

4. A method for producing an emulation circuit configuration from an integrated circuit, which comprises:

providing a microprocessor including a first wiring layer having conductor tracks with widened portions functioning as contacts;

applying a further wiring layer having conductor tracks to the microprocessor;

connecting the conductor tracks of the further wiring layer to the widened portions of the first wiring layer;

providing contact faces on the conductor tracks of the further wiring layer for allowing access to additional output signals provided in addition to regular output signals of the integrated circuit;

connecting the contact faces of the further wiring layer to external chip connections;

placing a second integrated circuit having input signal terminals and contact faces above the further wiring layer;

emulating the microprocessor with the second integrated circuit; and electrically conductively connecting the input signal terminals of the second integrated circuit to the contact faces of the further wiring layer of the microprocessor.

5. The method according to claim 4, further comprises:

adding a trace storage to the second integrated circuit.

6. The method according to claim 4, further comprises:

adding a program emulation memory to the second integrated circuit.

7. The method according to claim 4, further comprises:

setting and monitoring a program interrupt point with the second integrated circuit.

* * * * *